(12) United States Patent
Bullock

(10) Patent No.: US 7,994,476 B2
(45) Date of Patent: Aug. 9, 2011

(54) APPARATUS AND METHOD FOR ENHANCING VOLTAGE CONTRAST OF A WAFER

(75) Inventor: Eugene T. Bullock, Tucson, AZ (US)

(73) Assignee: Applied Materials Israel, Ltd., Rehovot (IL)

( * ) Notice: Subject to any disclaimer, the term of this patent is extended or adjusted under 35 U.S.C. 154(b) by 495 days.

(21) Appl. No.: 11/935,335

(22) Filed: Nov. 5, 2007

(65) Prior Publication Data

US 2009/0114817 A1    May 7, 2009

(51) Int. Cl.
*G01N 23/00* (2006.01)
*G21K 7/00* (2006.01)
*A61N 5/00* (2006.01)
(52) U.S. Cl. .................. 250/306; 250/307; 250/492.1
(58) Field of Classification Search .................. 250/306, 250/307, 310, 492.1, 492.2, 492.21, 492.22, 250/492.23, 492.3
See application file for complete search history.

(56) References Cited

U.S. PATENT DOCUMENTS

| | | | | |
|---|---|---|---|---|
| 6,211,518 | B1 * | 4/2001 | Richardson et al. | 250/310 |
| 7,253,410 | B1 * | 8/2007 | Bertsche et al. | 250/310 |
| 7,560,939 | B1 * | 7/2009 | De et al. | 324/751 |
| 2006/0289800 | A1 * | 12/2006 | Murrell et al. | 250/492.21 |

* cited by examiner

*Primary Examiner* — Robert Kim
*Assistant Examiner* — Brooke Purinton
(74) *Attorney, Agent, or Firm* — SNR Denton US LLP

(57) ABSTRACT

A system for electrically testing a semiconductor wafer, the system including (a) at least one charged particle beam focus effecting component and (b) at least one detector adapted to collect charged particles scattered from the wafer; wherein the system is adapted to scan a first area of a sample by a de-focused charged particle beam so as to affect a charging of the first area, scan at least a portion of the first area by a focused charged particle beam and detect electrons scattered from the at least portion. The system scans the at least portion while the first area remains affected by the de-focused charged particle beam. A method for electrically testing a semiconductor wafer includes scanning a first area of a sample by a de-focused charged particle beam so as to affect a charging of the first area; and scanning at least a portion of the first area by a focused charged particle beam while detecting electrons scattered from the at least portion, the at least portion being scanned while the first area remains affected by charging introduced by the de-focused charged particle beam.

15 Claims, 10 Drawing Sheets

200

APPARATUS AND METHOD FOR ENHANCING VOLTAGE CONTRAST OF A WAFER

FIELD OF THE INVENTION

This invention relates to an apparatus and method for inspecting and testing semiconductor wafers during circuit fabrication and, in particular, for testing wafers in a voltage-contrast mode.

BACKGROUND OF THE INVENTION

Integrated circuits are very complex devices that include multiple layers. Each layer may include conductive material, isolating material and/or semi-conductive material. These various materials are arranged in patterns, typically in accordance with the expected functionality of the integrated circuit. The patterns also reflect the manufacturing process of the integrated circuits.

Conductive layers typically include conductors made of conductive materials, wherein the conductors are separated by isolating materials such as various oxides. The dielectric layers are located between the conductive layers in an interlaced manner. Conductors of distinct conductive layers may be connected to each other and/or to the substrate by conductive materials (termed interconnects or vias) located within the dielectric layers. The substrate may include semi-conducting materials and at least a portion of the substrate is connected to a virtual ground.

Various inspection and failure analysis techniques have evolved for inspecting integrated circuits both during the fabrication stages, between consecutive manufacturing stages, either in combination with the manufacturing process (also termed "in line" inspection techniques) or not (also termed "off line" inspection techniques). Various optical as well as charged particle beam inspection tools and review tools are known in the art, such as the Compluss™, SEMVision™ and Insite™ of Applied Materials Inc. of Santa Clara, Calif.

Manufacturing failures may affect the electrical characteristics of the integrated circuits. Some of these failures result from unwanted disconnections between various elements of the integrated circuits. An under-etched via or conductor can be floating instead of being connected to a conducting sub-surface structure.

Such a failure can be detected due to charging differences between the defective structure and non-defective structures. In order to facilitate voltage contrast analysis there must be a charging difference between the defective structure and its surroundings.

Typically the sub-surface structure is electrically connected to the substrate of the wafer or is otherwise connected to an external voltage source or to the ground. Thus, the charging of the structure surrounding can be relatively easily controlled.

In order to perform an efficient voltage contrast measurement it is necessary to develop a substantial difference between the potential of the defective structure and the non-detective structures. In particular, to enable signal separation via energy filtering it is necessary to develop a difference in potential that is greater than the nominal energy width of the secondary electrons of the materials comprising the defective and non-defective structures.

Various techniques are known for performing voltage contrast measurements. A first technique includes using a flooding gun. The sample can be moved towards the flooding gun that directs a relatively large amount of electrons towards a predefined area, thus charging the area. The area is then scanned, by a scanning beam, in order to provide an image of that area. Another technique involves providing a bias voltage to the sample. Combinations of these techniques are also known. An example of a combination of both techniques is described in U.S. Pat. No. 6,828,571 to McCord et al., entitled "Apparatus and methods of controlling surface charge and focus". McCord also describes an auto-focus method that involves illuminating the sample with a tilted monitor beam.

Some inspection devices and methods scan the sample by an electron beam that is focused to a small spot-size such as is necessary to obtain the desired resolution. The diameter of the spot typically needs to be less than twice the desired resolution. For state-of-the-art semiconductor wafers this typically imposes the requirement that the spot size be less than 500 nm.

Typically, the electrical beam is scanned along a scan axis while the sample is mechanically shifted along a transverse axis. Thus, repetitive exposures of the same area are relatively avoided.

Many types of scanning electron microscopes are known, typically including an electron gun directing an electron beam at a target via a vacuum column comprising a condensing lens, scan coils, and an objective lens; a detector and associated amplifier receiving electrons emitted from the target, and a monitor.

An "octupole", according to Wikipedia, typically refers to "two electric or magnetic quadrupoles having charge distributions of opposite signs and separated from each other by a small distance" and/or "any device for controlling beams of electrons or other charged particles, consisting of eight electrodes or magnetic poles arranged in a circular pattern, with alternating polarities; commonly used to correct aberrations of quadrupole systems."

The SemVision/G2 is a commercially available system which employs, among other methods, a 'delta-charging' technique.

The disclosures of all publications and patent documents mentioned in the specification, and of the publications and patent documents cited therein directly or indirectly, are hereby incorporated by reference.

SUMMARY OF THE INVENTION

An embodiment of the present invention seeks to provide a method for electrically testing a semiconductor wafer, the method including scanning a first area of a sample by a de-focused charged particle beam so as to affect a charging of the first area; and scanning at least a portion of the first area by a focused charged particle beam while detecting electrons scattered from the at least portion; wherein the at least portion is scanned while the first area remains affected by charging introduced by the de-focused charged particle beam. Alternatively or in addition, a system for electrically testing a semiconductor wafer is provided, the system including at least one charged particle beam focus effecting component, at least one detector adapted to collect charged particles scattered from the wafer; wherein the system is adapted to: (i) scan a first area of a sample by a de-focused charged particle beam so as to affect a charging of the first area, scan at least a portion of the first area by a focused charged particle beam and detect electrons scattered from the at least portion: wherein the system scans the at least portion while the first area remains affected by the de-focused charged particle beam.

According to certain embodiments of the invention, the fly-back/retrace portion of the scan is used to perform an on-the-fly pre-charging process on the wafer surface, typically including defocusing the beam to increase the level of charging and the charge uniformity obtained.

There is thus provided, in accordance with certain embodiments of the present invention, a method for electrically testing a semiconductor wafer, the method including: (a) scanning a charged particle beam along at least one scan line while maintaining a substantially focused beam constituting a first scanned area; (b) scanning a charged particle beam along at least one scan line while maintaining a substantially defocused beam so as to control the charging of at least an area that includes the first scanned area; and (c) repeating the scanning steps until a predefined section of the wafer is scanned. The order need not be precisely as above, e.g. steps (a) and (b) may be interchanged such that the defocused charge controlling step can precede the focused step.

Also provided, in accordance with certain embodiments of the present invention, is a system for electrically testing a semiconductor wafer, the system including (a) a charged particle beam source; (b) a focusing element that can be varied including but not limited to a lens element, the beam energy or a cylindrical electrode; (c) at least one detector adapted to collect charged particles scattered from the wafer; and (d) a controlling system adapted to: (i) control the charged particle beam such that the charged particle beam scans along at least one scan line while maintaining a substantially focused beam, and to allow the detector to collect charged particles scattered from the first scanned portion; (ii) control the charged particle beam such that the charged particle beam scans along at least one other scan line while maintaining a substantially defocused beam so as to control the charging of at least an area that includes the first scanned portions; and (iii) determine to repeat (i) and (ii) until a predefined section of the wafer is scanned; the order of (i) and (ii) in time can be interchanged.

Also provided, in accordance with certain embodiments of the present invention, is a method for electrically testing a semiconductor wafer, the method comprising scanning a first area of a sample by a defocused charged particle beam so as to affect a charging of the first area and scanning at least a portion of the first area, using a scanning pattern, by a focused charged particle beam while detecting electrons scattered from the at least portion, wherein the scanning pattern comprises a set of at least one scan lines and wherein each scan line in the set is scanned by the focused charged particle beam while that scan line remains affected by charging introduced by the de-focused charged particle beam.

Further in accordance with certain embodiments of the present invention, a spot size formed by the de-focused charged particle beam is substantially larger than a spot size formed by the focused charged particle beam.

Still further in accordance with certain embodiments of the present invention, the de-focused charged particle beam scans along a de-focused scan line and the focused charged particle beam scans along a focused scan line wherein the de-focused scan line is parallel to the focused scan line.

Further in accordance with certain embodiments of the present invention, the de-focused charged particle beam scans along a de-focused scan line and the focused charged particle beam scan along a focused scan line wherein the de-focused scan line is transverse to the focused scan line.

Additionally in accordance with certain embodiments of the present invention, the de-focused charged particle beam scans along a de-focused scan line in a first direction and the focused charged particle beam scans along a focused scan line in a second direction substantially opposite to the first direction.

Further in accordance with certain embodiments of the present invention, the de-focused charged particle beam scans along multiple de-focused scan lines and the focused charged particle beam scans along multiple focused scan lines wherein the multiple focused scan lines are positioned between adjacent ones of the multiple de-focused scan lines.

Still further in accordance with certain embodiments of the present invention, the first scanning includes introducing a defocusing electrostatic field in the vicinity of the wafer.

Further in accordance with certain embodiments of the present invention, the first scanning includes introducing a de-focusing electrostatic field at a location that is remote from the wafer.

Still further in accordance with certain embodiments of the present invention, the first scanning comprises de-focusing the charged particle beam during a de-focusing period which is less than a few scan lines in duration.

Additionally in accordance with certain embodiments of the present invention, the second scanning comprises focusing the charged particle beam during a focusing period which is less than a few scan lines in duration.

Also provided, in accordance with certain embodiments of the present invention, is a system for electrically testing a semiconductor wafer, the system comprising at least one charged particle beam focus effecting component operative to generate at least one focused charged particle beam and at least one de-focused charged particle beam; and at least one detector adapted to collect charged particles scattered from the wafer, wherein the system is adapted to: (i) scan a first area of a sample using the de-focused charged particle beam so as to affect a charging of the first area, scan at least a portion of the first area, using a scanning pattern and the focused charged particle beam, and detect electrons scattered from the at least portion; wherein the scanning pattern comprises a set of at least one scan line and wherein each scan line in the set is scanned by the focused charged particle beam while that scan line remains affected by charging introduced by the de-focused charged particle beam.

Further in accordance with certain embodiments of the present invention, a spot size formed by the de-focused charged particle beam is substantially larger than a spot size formed by the focused charged particle beam.

Still further in accordance with certain embodiments of the present invention, the de-focused charged particle beam scans along a de-focused scan line and the focused charged particle beam scans along a focused scan line wherein the de-focused scan line is parallel to the focused scan line.

Further in accordance with certain embodiments of the present invention, the de-focused charged particle beam scans along a de-focused scan line and the focused charged particle beam scans along a focused scan line wherein the de-focused scan line is transverse to the focused scan line.

Still further in accordance with certain embodiments of the present invention, the de-focused charged particle beam scans along a de-focused scan line in a first direction and the focused charged particle beam scan along a focused scan line in a second direction substantially opposite to the first direction.

Additionally in accordance with certain embodiments of the present invention, the de-focused charged particle beam scans along multiple de-focused scan lines and the focused charged particle beam scans along multiple focused scan lines wherein the multiple focused scan lines are interspersed between adjacent ones of the de-focused scan lines.

Further in accordance with certain embodiments of the present invention, at least one charged particle beam focus effecting component is adapted to de-focus the charged particle beam by introducing a de-focusing electrostatic field in the vicinity of the wafer.

Still further in accordance with certain embodiments of the present invention, at least one charged particle beam focus effecting component is adapted to de-focus the charged particle beam by introducing a de-focusing electrostatic field that is remote from the wafer.

Further provided, in accordance with certain embodiments of the present invention, is a method for electrically testing a semiconductor wafer, the method comprising scanning the wafer, scan line by scan line, thereby to define a temporal sequence of scan lines, using a relatively focused charged particle beam; and prior to scanning of each individual scan line in the temporal sequence with the particle beam, and subsequent to scanning, with the particle beam, the scan line just prior to the individual scan line in the temporal sequence, pre-charging an area including the individual scan line using a relatively de-focused charged particle beam.

Still further in accordance with certain embodiments of the present invention, the scanning step is performed by a scanning electron microscope (SEM).

Further in accordance with certain embodiments of the present invention, the scan lines each have a uniform width, wherein the beam has a width which defines the uniform width of the scan lines.

Still further in accordance with certain embodiments of the present invention, the arrangement of the scan lines on the wafer defines a physical sequence of scan lines and wherein the temporal sequence of scan lines is dissimilar to the physical sequence of scan lines.

Additionally in accordance with certain embodiments of the present invention, pre-charging comprises de-focusing the focused charged particle beam, thereby to provide the de-focused charged particle beam.

Further in accordance with certain embodiments of the present invention, the scan lines in the set are spaced so as to substantially prevent previously scanned scan lines from substantially altering charging introduced by the de-focused charged particle beam in subsequently scanned scan lines.

Also provided, in accordance with certain embodiments of the present invention, is a method for electrically testing a semiconductor wafer, the method comprising scanning a first area of a sample by a de-focused charged particle beam so as to affect a charging of the first area; and scanning at least a portion of the first area by a focused charged particle beam while detecting electrons scattered from the at least portion, wherein the at least portion is scanned while the first area remains affected by charging introduced by the de-focused charged particle beam.

Particular advantages of certain embodiments of the present invention include the following: that, in contrast to conventional systems, the charge generally does not dissipate due to time elapsing between the pre-charge step and the actual focused scan step, and/or that the scan step is performed one pass at a time so as to eliminate, completely or very substantially, interference between adjacent passes of the scan step.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

BRIEF DESCRIPTION OF THE DRAWINGS

In order to understand the invention and to see how it may be carried out in practice, certain embodiments will now be described, by way of non-limiting example only, with reference to the accompanying drawings, in which.

DETAILED DESCRIPTION OF THE INVENTION

The following description relates to charged particle microscopes, such as Scanning Electron Microscopes (SEMs), in particular step and repeat type SEMs, in which a wafer is typically scanned by repetitive steps of scanning an area of the wafer (the area defined by the field of view of the SEM) and mechanically introducing relative motion between the wafer and SEM to facilitate the scanning of another area.

This relative motion may for example be implemented by electrostatic and/or magnetic fields introduced by various electrostatic and/or magnetic elements such as a lens, deflector and the like. It is noted that other charged particles and even photons may be utilized for detecting voltage contrast. It is further noted that this invention may also be implemented by introducing a substantially constant movement between the SEM and the wafer. The relative motion may be linear or even rotational, and/or any combination of both.

According to an embodiment of the invention the de-focusing is achieved by varying a beam limiting aperture which also changes the beam current.

Figure 1:
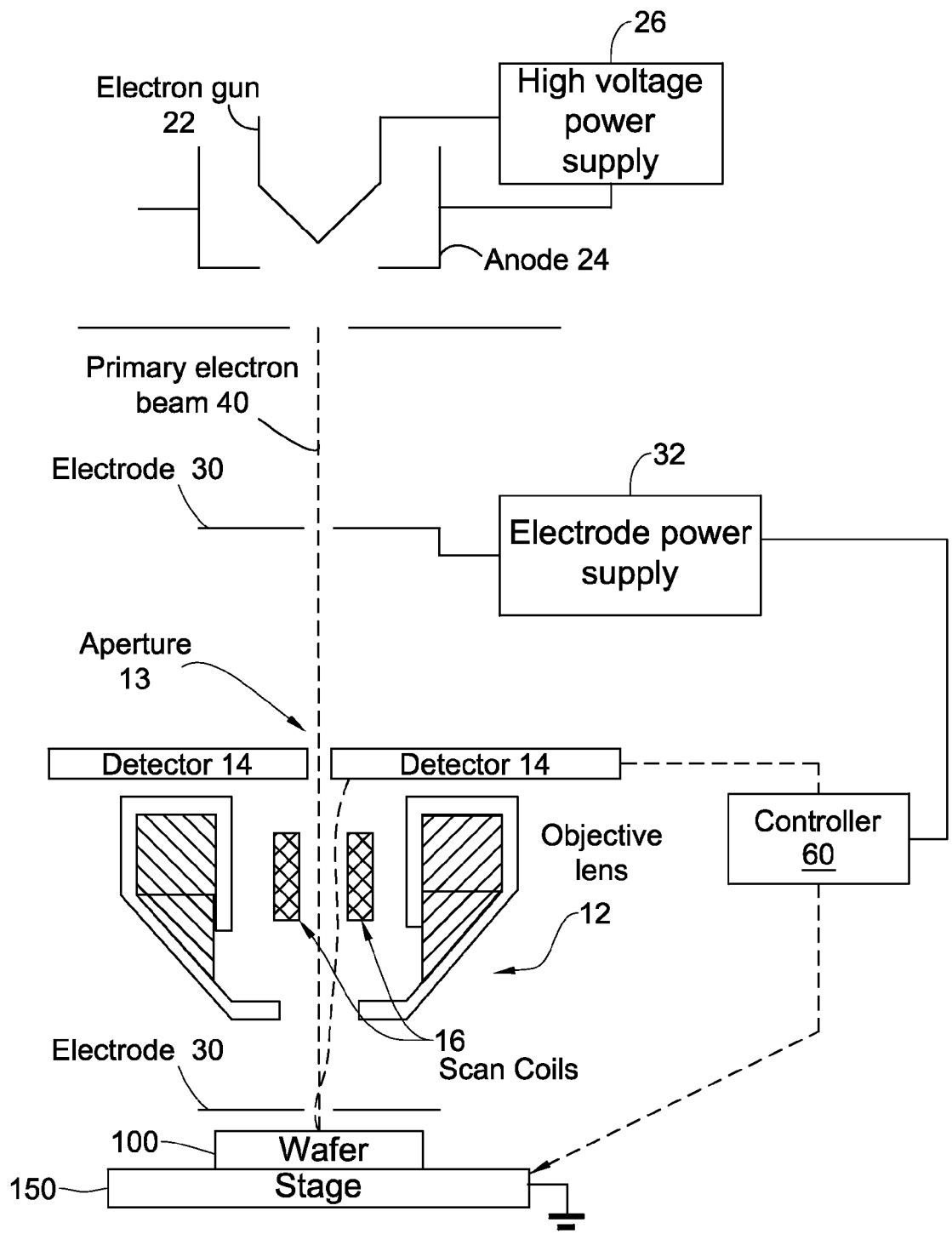
FIG. 1 is a simplified cross-sectional illustration of a voltage contrast measurement system, according to an embodiment of the invention.

FIG. 1 illustrates a scanning electron microscope (SEM) that is capable of voltage contrast analysis, according to an embodiment of the invention. The SEM of FIG. 1 includes an electron gun 22, an anode 24 and a high voltage power supply 26 that are operable to generate a primary electron beam 40.

According to an embodiment of the invention the charged particle beam 40 is repetitively focused and de-focused during the voltage contrast analysis. The de-focusing involves altering the energy of the charged particle beam 40. In addition, the magnetic field can also be altered, although magnetic fields are characterized by a change rate which is slow relative to that engendered by the electrostatic elements.

According to an embodiment of the invention the SEM of FIG. 1 includes at least one charged particle beam focus altering component e.g. as described in detail below with reference to FIGS. 8A-9C. This component can alter the focus of the charged particle beam in a relatively fast manner. Such a component can be located between the electron gun 22 and the wafer 100.

Typically, the electrostatic field can be altered relatively fast, thus fast de-focusing (and focusing) effects can include altering the voltage that is supplied to various electrodes such as electrode 30, anode 24 and even to the electron gun 22 e.g. as described in detail below with reference to FIGS. 8A-9C. Electrode 30 is positioned near wafer 100 and can affect the electrostatic field near wafer 100 while other electrodes are positioned far from the wafer 100.

The SEM of FIG. 1 typically further includes a detector 14 that has an aperture 13 through which the primary electron beam 40 can pass, an objective lens 12 capable of focusing the primary electron beam onto the wafer 100, a controller 60 and a stage 150. Objective lens 12 typically includes an electrostatic lens and a magnetic lens that introduce electrostatic and magnetic fields that leak from the objective lens 12.

The SEM of FIG. 1 can include additional components such as deflecting units dial deflect the primary electron beam so as to scan the wafer, as well as additional control and voltage supply units that are not shown in FIG. 1 for simplicity of explanation.

In the SEM of FIG. 1 the primary electron beam 40 is directed through aperture 13 within the detector 14 to be focused by the objective lens 12 onto an inspected wafer 100. The primary electron beam interacts with wafer 100 and as a result various types of electrons, such as secondary electrons, back-scattered electrons, Auger electrons and/or X-ray quanta are reflected or scattered. Secondary electrons can be collected easily. Most SEMs mainly detect these secondary electrons e.g. by detector 14 as shown. The detector 14 is connected to controller 60 that is capable of generating, e.g. conventionally, an image of the scanned wafer in response to the amplitude of collected secondary electrons and the location of the primary electron beam 40 in relation to the wafer 100.

Controller 60 is also typically connected to the stage 150 for controlling a mechanical movement introduced between wafer 100 and other parts of the SEM of FIG. 1, such as the electrode. Controller 60 typically controls the various components of the SEM of FIG. 1, including the high voltage power supply 26, the electrode voltage supply unit 32, the deflecting units (not shown), and the like. Typically the deflection units are controlled by an X-scan signal and a Y-scan signal. It is noted that the controller 60 may include multiple software and hardware components, and may comprise either a single device or multiple devices.

Typically, the stage 150 moves the wafer 100 along a Y-axis while the electrical beam is deflected along an X-axis. This is not necessarily so and other combinations can be applied, including introducing mechanical movement along a first axis and deflecting the electron beam along a second axis that is not normal to the first axis. Furthermore, the direction of successive scans can be the same as or opposite to each other. The SEM of FIG. 1 can include additional detectors, energy filters and the like, not shown for simplicity.

Although FIG. 1 illustrates a single electrode 30 for controlling charge, this is not necessarily the case and multiple electrodes, as well as an electrode that is segmented to multiple portions, can be applied to control the charging of the wafer 100.

Figure 2:
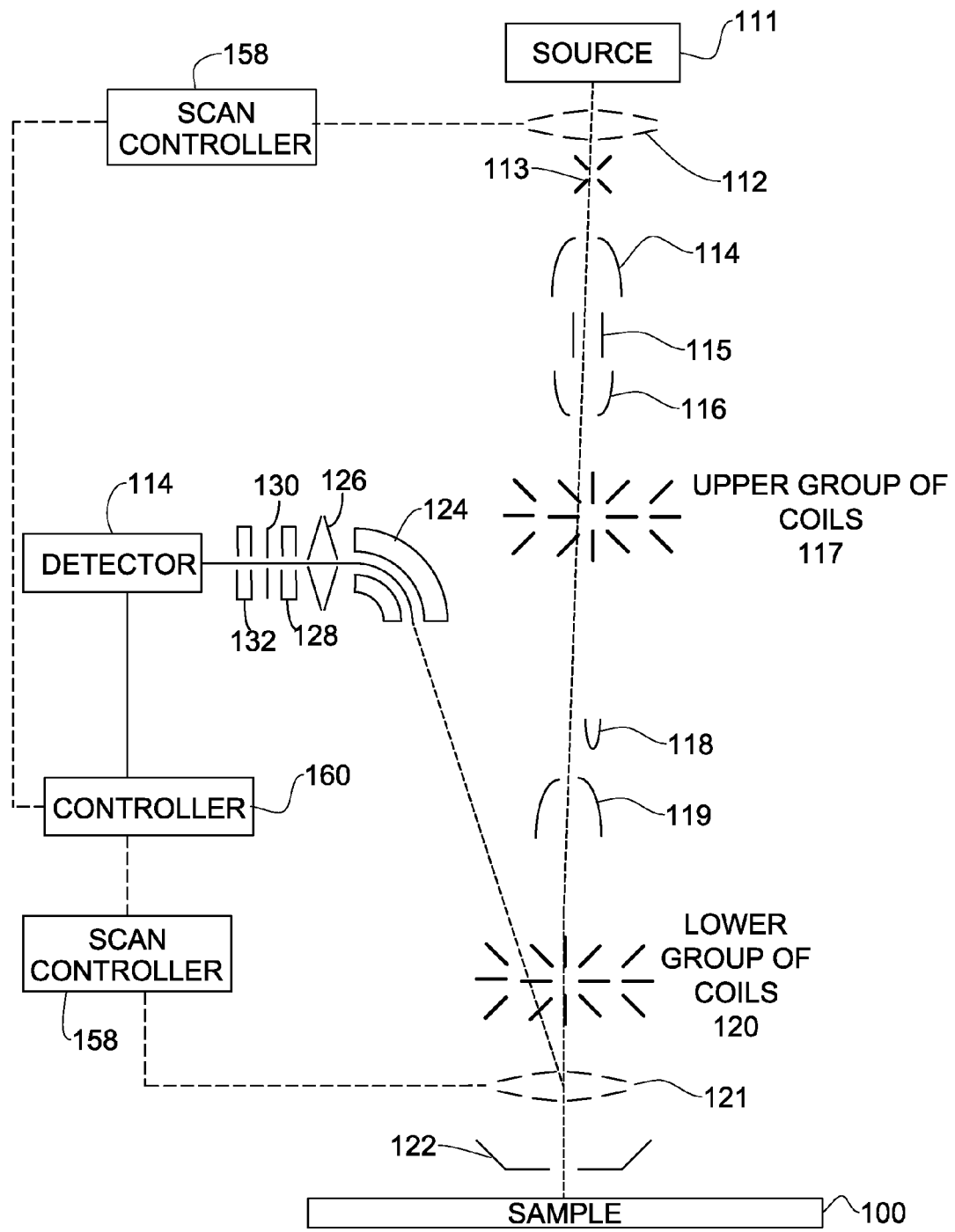
FIG. 2 is a simplified cross-sectional illustration of a voltage contrast measurement system, according to another embodiment of the invention.

FIG. 2 illustrates a scanning electron microscope (SEM) capable of voltage contrast analysis, according to another embodiment of the invention. It is appreciated that some of the components of the embodiments of the invention shown in FIG. 2 and elsewhere, are optional. The apparatus of FIG. 2 includes illumination optics and inspection optics. The illumination optics generate and direct a charged particle beam towards the sample. The focal point of the charged particle beam can be altered by various components of the illumination optics.

The term "optics" includes components such as objective lenses, magnetic coils, pole-pieces, electrostatic lenses, apertures, scanners, and the like. These components affect various characteristics of the charged particle beam. The optics can also include components such as power supplies, current supply sources, components that control these components and the like. The illumination path includes a charged particle beam source 111. The source 111 may be conventional and typically includes an electron gun, a filament, a suppressor, an extractor and an anode in mutual operative association with one another.

The charged particle beam source 111 is operatively associated, e.g. as shown, with an upper octupole 112, aperture alignment coils 113, beam defining aperture 114, blanker 115, differential vacuum aperture 116, an upper group of coils 117, a blanking aperture 119, a lower group of coils 120 which may be used for de-focusing as described herein, a lower octupole 121 which may be used for de-focusing as described herein and a magnetic objective lens 122. The charged particle beam can also be diverted to a Faraday cup 118.

The inspection path typically includes the magnetic objective lens 122, the lower octupole 121, the lower group of coils 120, beam bending electrodes 124, an electrostatic quadrapole 126, an electrostatic focus lens 128, a grounded aperture 130, an electrostatic filter 132 and a detector 134. Various components receive high voltage supply from a high voltage module as is conventional. Various components, and especially magnetic components receive current from a current supply module.

The charged particle beam can be focused and de-focused by various components of the illumination path such as the upper and lower group of coils 117 and 120, typically in conjunction with the upper and lower octupoles 112 and 121. Find focal point changes are typically achieved by the octupoles.

Typically, the inspection system also includes a stage, image processors, a vacuum chamber, optical components, a human machine interface and the like. The charged particle beam propagates through a vacuum.

Figure 3:
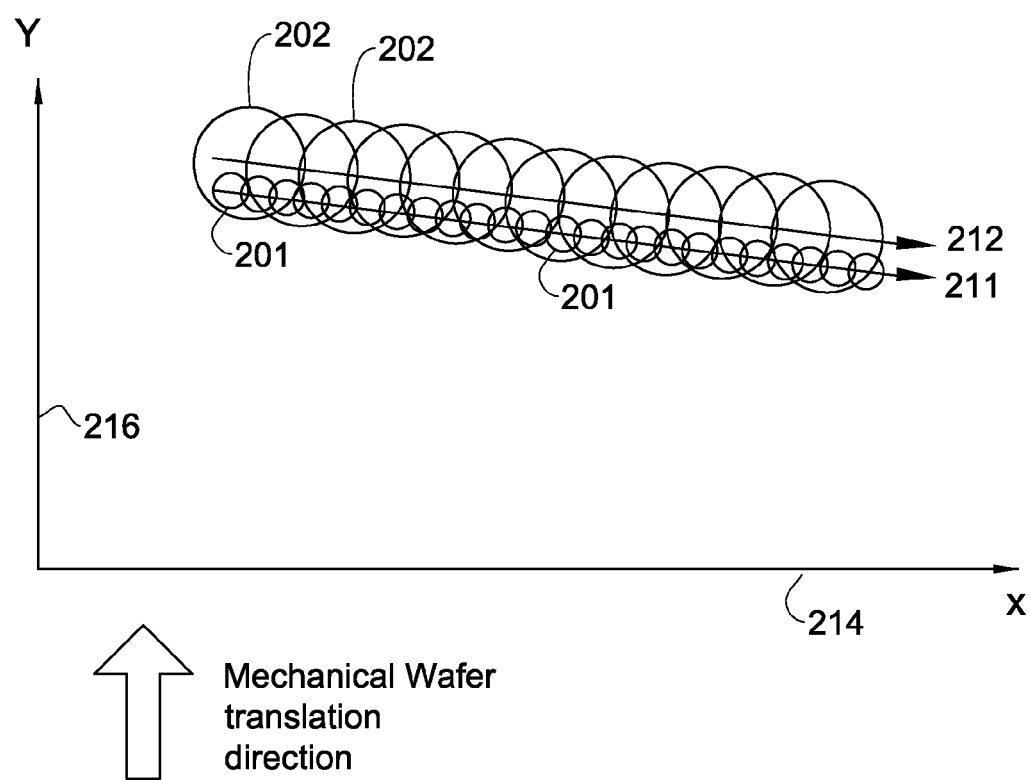
FIG. 3 illustrates a scan pattern, according to an embodiment of the invention.

FIG. 3 illustrates a first scan pattern, which may be provided by a SEM such as the SEMs of FIGS. 1-2, according to an embodiment of the invention. The wafer 100 may be translated along a Y-axis while the primary electron beam 40 may be deflected along an X-axis. FIG. 3 also illustrates the small spots 201 that are formed by the focused beam and the large spots 202 formed by the de-focused beam. Each of these spots interacts with the portion of the wafer that they respectively illuminate.

The scan pattern 200 starts by scanning a de-focused charged particle beam, e.g. from left to right, along a de-focused scan line 212. The de-focused scan line 212 is oriented at a small negative angle in relation to the X-axis 214, due to the Y-axis 216 (say) translation of the wafer 100. During this phase a first area that includes the combined areas of all large spots 202 is charged.

Once the de-focused beam ends its scan, the beam 40 is focused during a short focusing period. During this focusing period the beam 40 can scan the wafer e.g. from right to left, but can also be blanked. For simplicity of explanation the path of the beam during the focusing period is not shown.

At the end of the focusing period the focused beam scans along a focused scan line 211. FIG. 3 illustrates a focused scan line 211 that is parallel to the de-focused scan line 212, but this need not be the case.

Other scan patterns, which may be provided by a SEM such as the SEMs of FIGS. 1-2, according to various embodiments of the invention, are now described.

Figure 4:
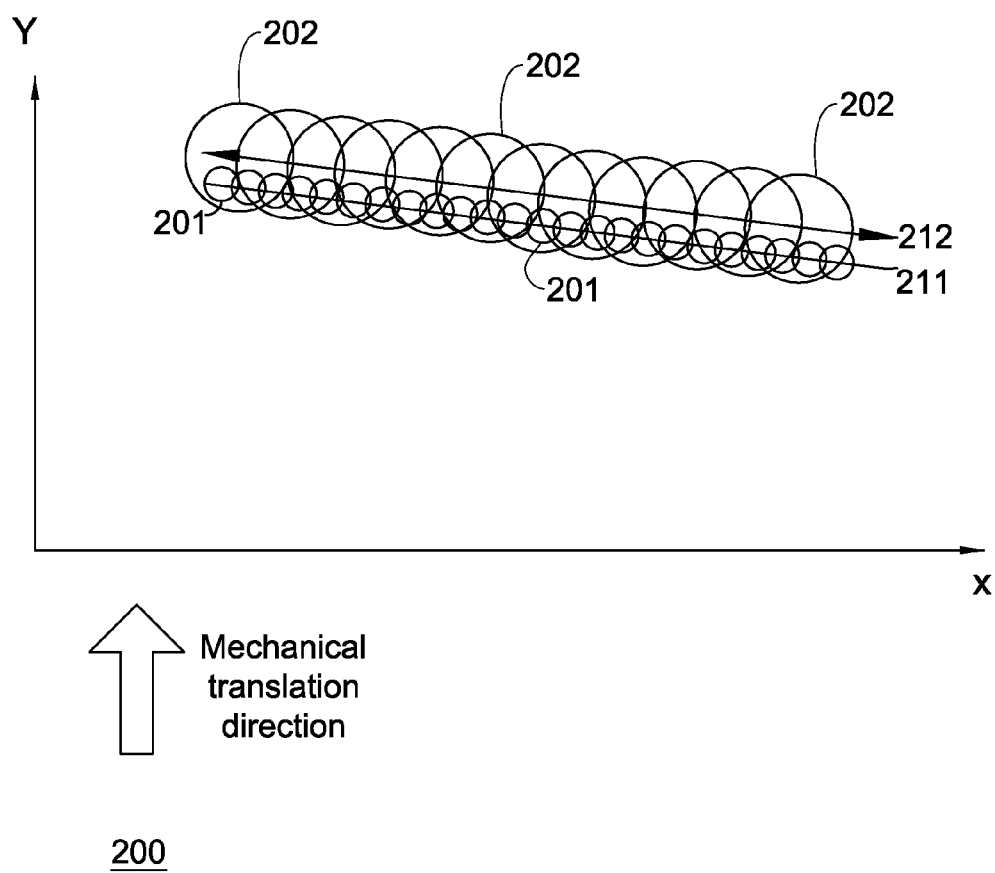
FIG. 4 illustrates a scan pattern, according to another embodiment of the invention.

In the scan pattern of FIG. 4, a focused scan line 211 is parallel to the de-focused scan line but is oriented at an opposite direction; if the focused scan line points (say) to the right, the de-focused scan line points to the left.

Figure 5:
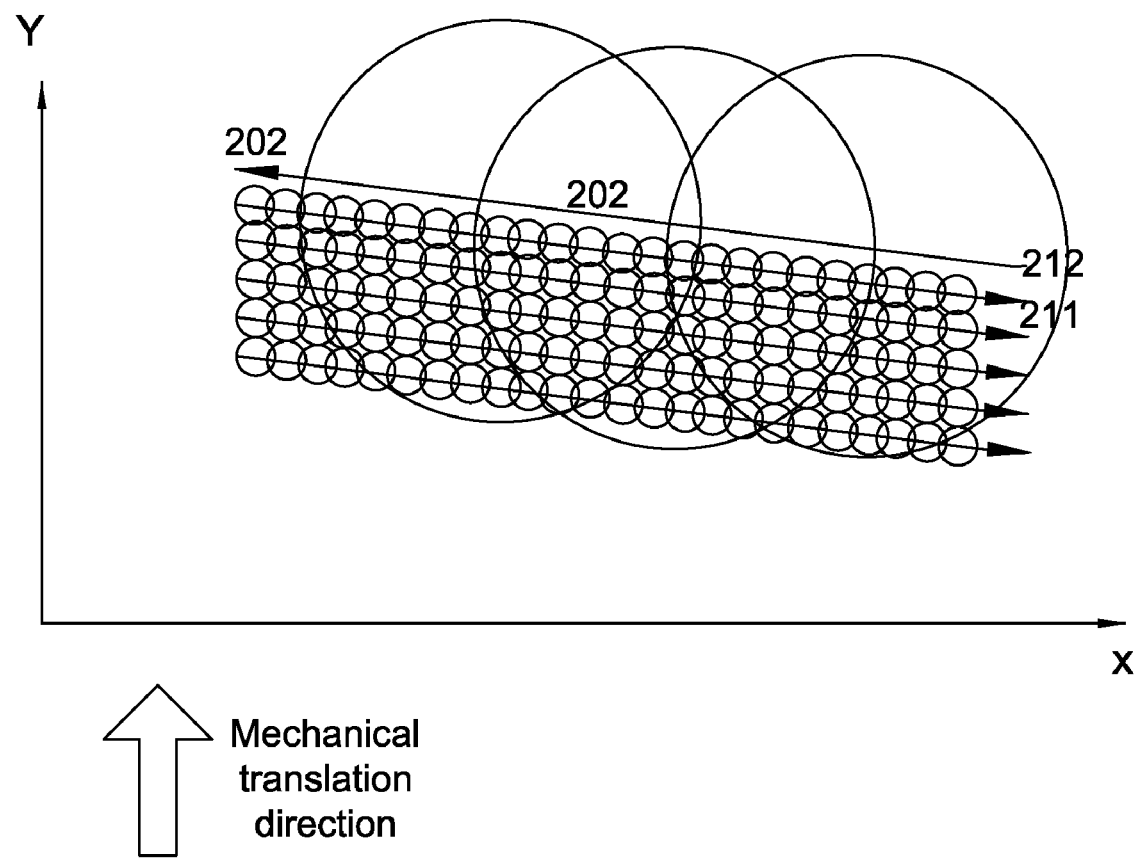
FIG. 5 illustrates a scan pattern, according to a further embodiment of the invention.

In the scan pattern of FIG. 5, five focused scan lines 211 are interspersed between adjacent de-focused scan line 212.

Figure 6:
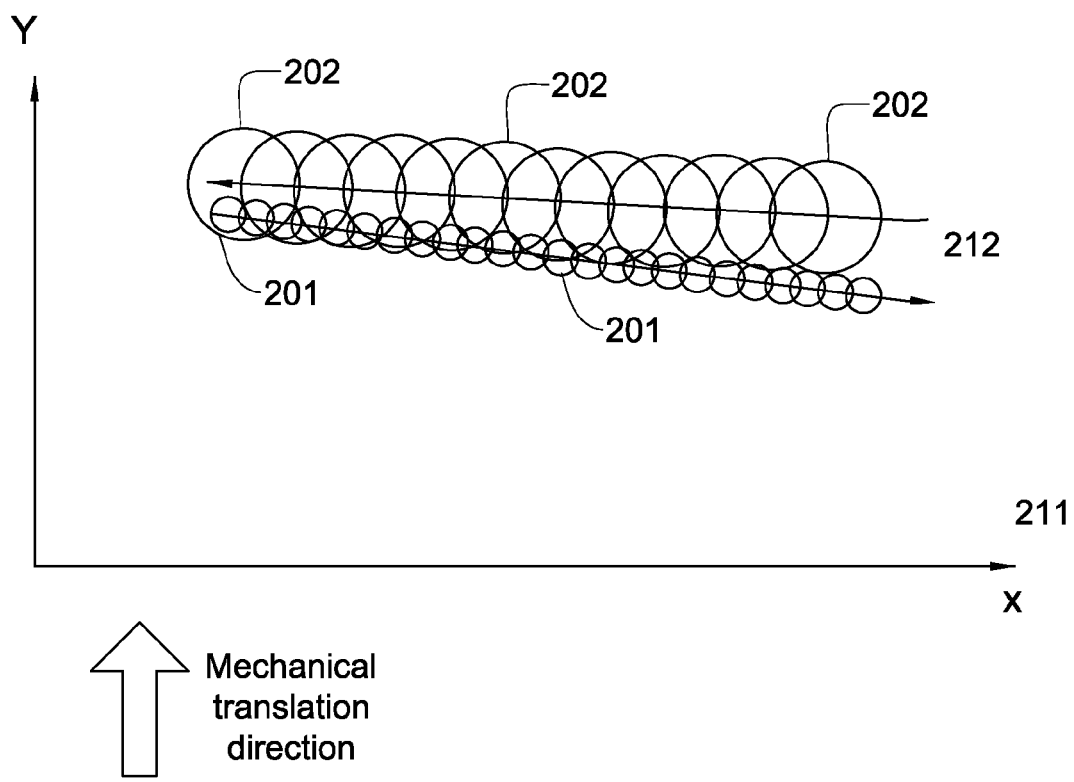
FIG. 6 illustrates a scan pattern, according to yet a further embodiment of the invention.

In the scan pattern of FIG. 6, a focused scan-line 211 is transverse to the de-focused scan line 212. This orientation can be achieved in various manners, including electrical scanning along the Y axis, altering the scan velocity, altering the Y axis mechanical shift and the like.

Typically, the charge control scan lines can be rotated or shifted as necessary to give uniform charge control in relation to the scan and image lines. According to an embodiment of the invention the duty cycle (the ratio between the charge control period and the image acquisition period) can be varied as a means of controlling the charging.

The variations can be responsive, for example, to the images acquired during the voltage contrast analysis, to previously acquired images, to the charging characteristics of the scanned area, and the like. According to an embodiment of the invention the amount of de-focusing can be controlled as a means of controlling the charging.

According to various embodiments of the invention the de-focusing can be utilized for performing negative precharging or positive pre-charging.

According to yet another embodiment of the invention, as shown with reference to FIGS. 8A-9C, the voltage supplied to electrode 30 can be modulated so as to induce fast changes in the focus of beam 40 as well as for charging (or discharging) wafer 100.

According to another embodiment of the invention the focusing and de-focusing is achieved by using a component that differs from electrode 70 and performing both de-focusing of beam 40 as well as independently controlling the voltage supplied to electrode 70 so as to charge or discharge wafer 100.

According to another embodiment of the invention the changes of the focusing of the beam 40 can occur during a first period while the potential supplied to electrode 70 occurs in another period. For example, the beam 40 is de-focused so as to generate increased charging, and then the electrode 70 can receive a supply voltage that discharges previously induced charge.

Figure 7A:
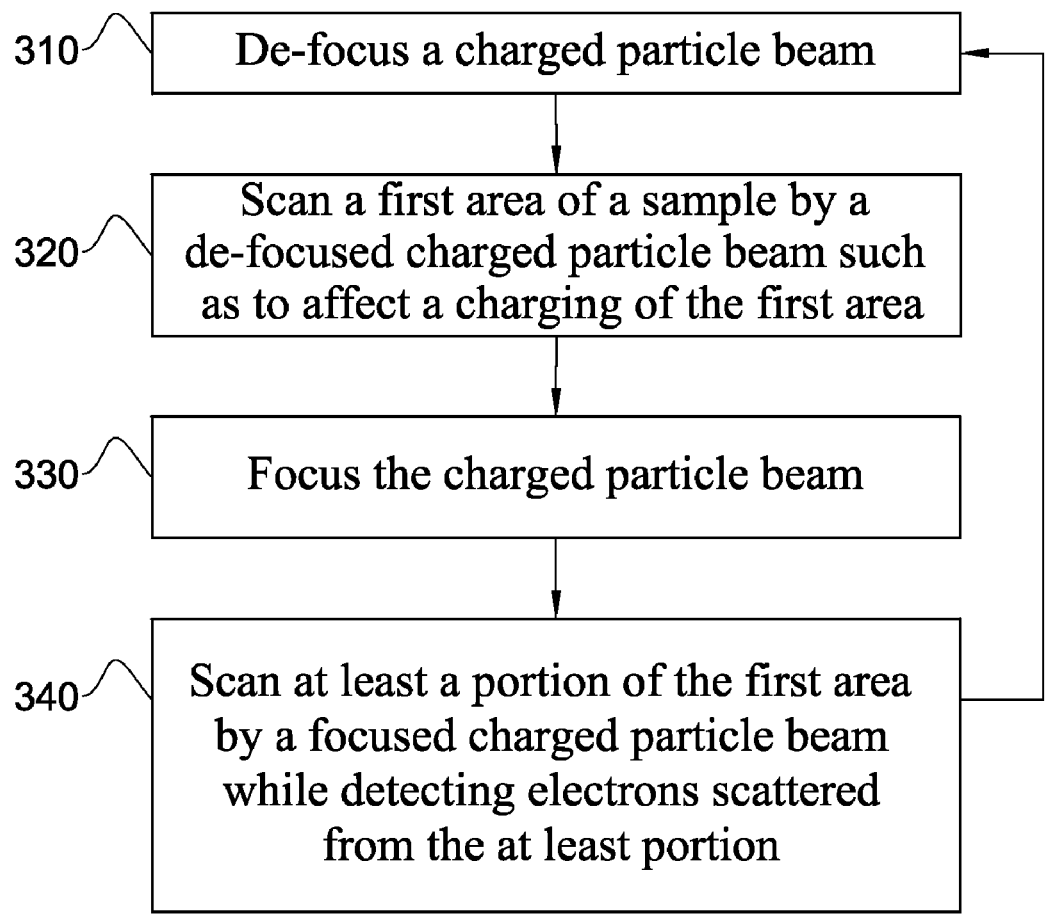
FIGS. 7A-7C are simplified flowchart illustrations for methods of operation of the systems of FIGS. 1-2, according to certain embodiments of the invention.
Figure 7B:
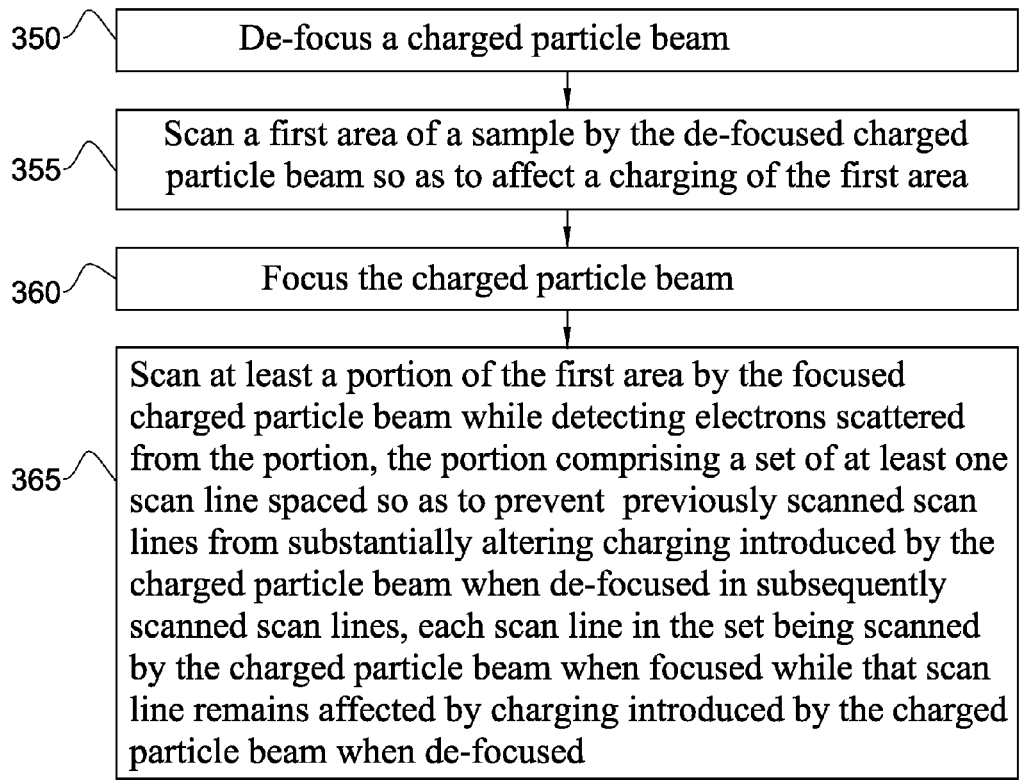
Figure 7C:
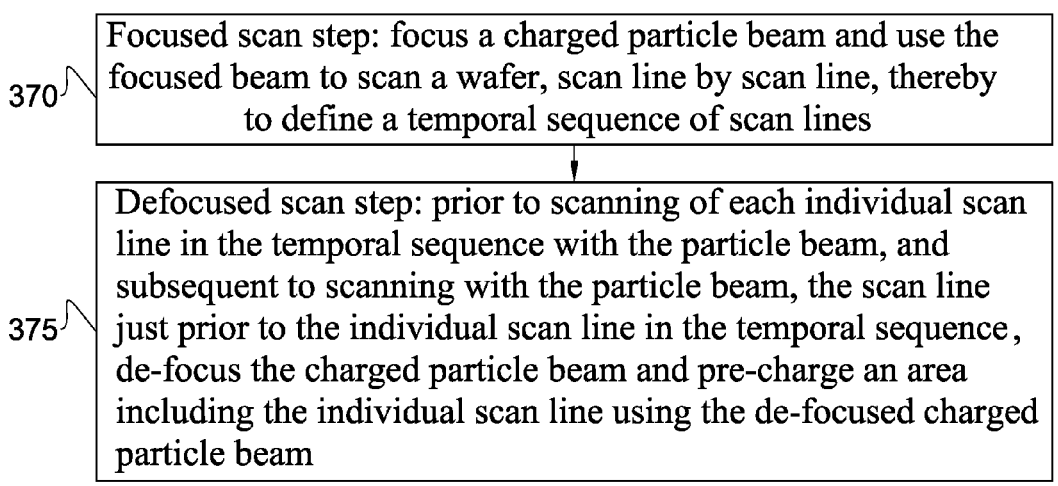

FIGS. 7A-7C are simplified flow chart illustrations of methods for electrically testing a semiconductor wafer, e.g. using the apparatus of FIG. 1 or 2, all according to certain embodiments of the invention.

In the method of FIG. 7A, a charged particle beam is de-focused. Typically, step 310 includes introducing a de-focusing electrostatic field at a vicinity of the wafer. According to another embodiment of the invention, step 310 includes introducing a de-focusing electrostatic field at a location that is remote from the wafer. Typically step 310 occurs during a short de-focusing period.

Step 310 is followed by step 320 comprising scanning a first area of a sample by a de-focused charged particle beam so as to affect a charging of the first area, e.g. using any of the scan patterns of FIGS. 3-6. Step 320 is followed by step 330 of focusing the charged particle beam. Typically, step 330 includes introducing a focusing electrostatic field in the vicinity of the wafer. According to another embodiment of the invention, step 330 includes introducing a focusing electrostatic field at a location that is remote from the wafer. Typically step 330 occurs during a short focusing period.

Step 330 is followed by step 340 including scanning at least a portion of the first area by a focused charged particle beam while detecting electrons scattered from the at least portion. Step 340 is executed while the first area remains affected by charging introduced by the de-focused charged particle beam. Typically, step 340 is executed shortly after step 320 is completed. Step 340 is followed by step 310 until a predefined criteria is fulfilled. This criteria can be fulfilled if a predefined area is scanned, if a defect is detected and the like.

Typically, the spot size formed by the de-focused charged particle beam is substantially larger than the spot size formed by the focused charged particle beam. The ratio between the spot sizes can be responsive to the amount of required charging, the length of the charging period and the de-focusing and focusing speed and accuracy of the system.

Typically, the de-focused charged particle beam scans along a de-focused scan line and the focused charged particle beam scans along a focused scan line. According to an embodiment of the invention the de-focused scan line is parallel to the focused scan line as in FIGS. 3-5. According to yet another embodiment of the invention the de-focused an line is transverse to the focused scan line as shown in FIG. 6. According to a further embodiment of the invention the de-focused scan line is substantially opposite to the focused scan line.

Typically, multiple focused scan lines are interspersed between adjacent de-focused scan lines.

It is appreciated that practicing the invention as shown and described herein typically involves rapidly de-focusing a focused beam, or rapidly focusing a de-focused beam. It is desired that the change in focus should require only an order of magnitude of microseconds and preferably even less than a microsecond. A preferred method of achieving this is described herein with reference to FIGS. 8A-9C.

Figure 8A:
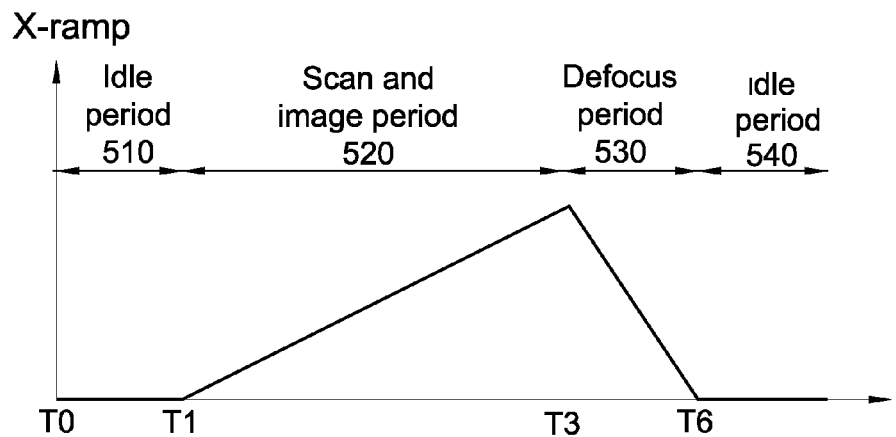
FIGS. 8A-8D, taken together, form a signal diagram useful in achieving rapid focusing and defocusing of the electron beam using a focusing electrode in the column.
Figure 8B:
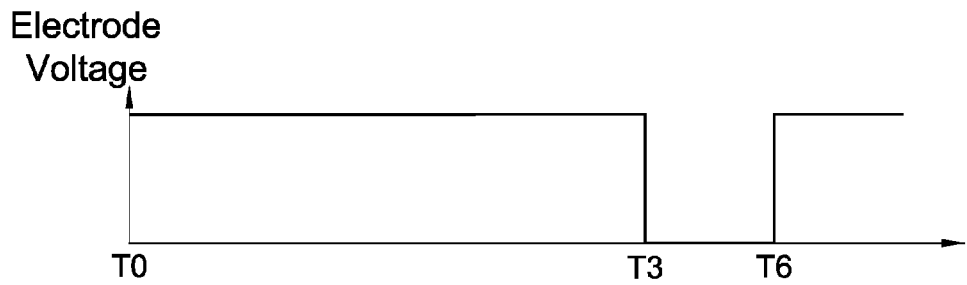
Figure 8C:
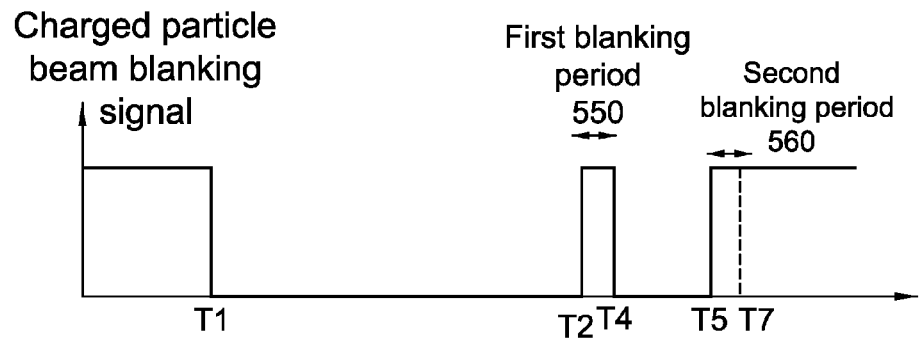
Figure 8D:
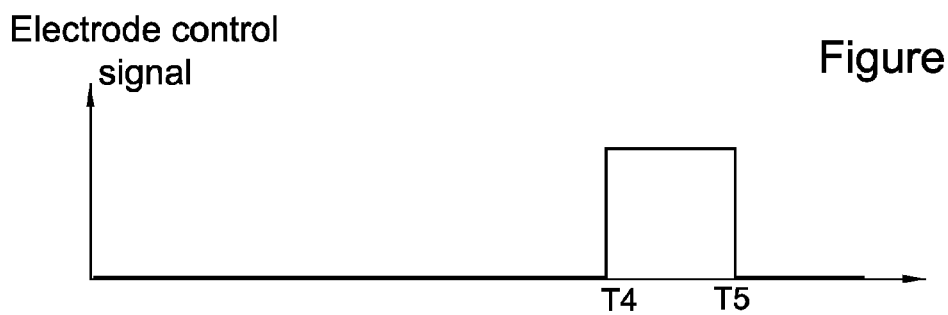

FIGS. 8A-8D, taken together, form a signal diagram useful in achieving rapid focusing and defocusing of the electron beam using a focusing electrode in the column. FIG. 8A shows a scan ramp which may be used to scan and retrace the beam 40 as would be applied to the scan coils 16 of FIG. 1 or the lower octupole 121 of FIG. 2. FIG. 5B shows a voltage change which may be applied to the electrode 30 of FIG. 1 to cause the change in focus. FIG. 8C shows an optional blank signal applied to the blanker 115 of FIG. 2 to prevent exposure of the wafer during the transition. FIG. 8D shows the control signal sent by the controller 60 to the electrode power supply 32 of FIG. 1. During the re-trace 13 to 16 (defocus period 530), the electrode control signal is toggled to defocus the beam.

Figure 9A:
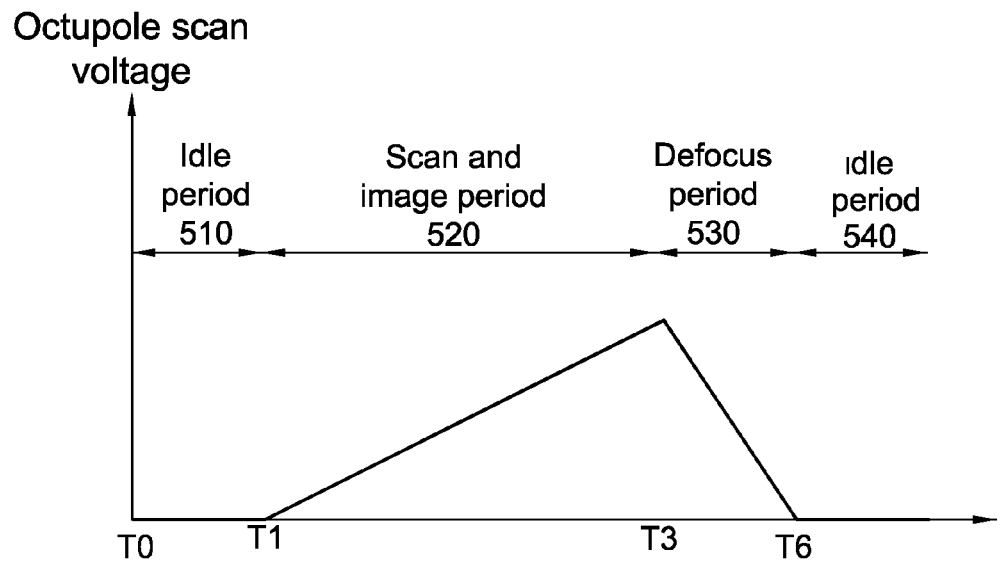
FIGS. 9A-9C, taken together, form a signal diagram useful in achieving rapid focusing and defocusing of the electron beam using an electrostatic scan deflector array such as a quadrupole or an octupole.
Figure 9B:
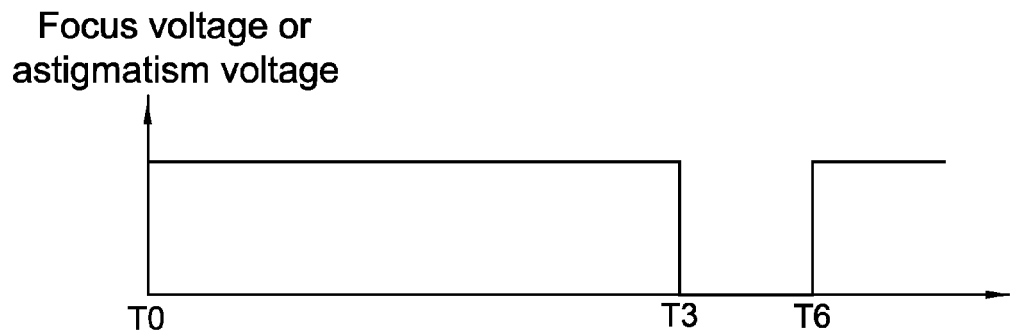
Figure 9C:
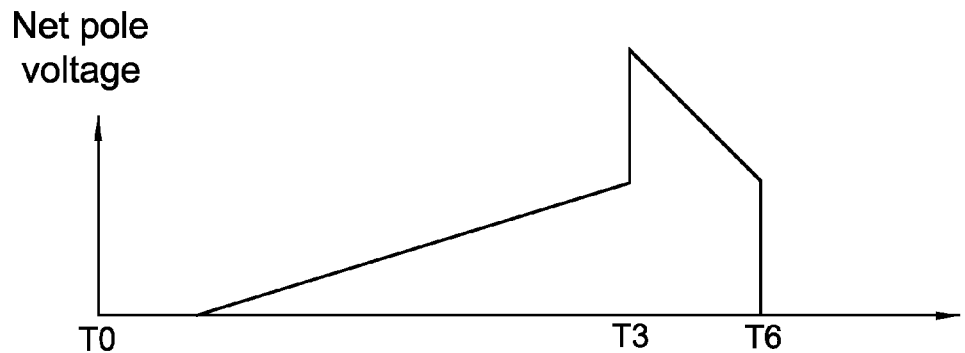

FIGS. 9A-9C, taken together, form a signal diagram useful in achieving rapid focusing and defocusing of the electron beam using an electrostatic scan deflector array such as a quadrupole or an octupole. FIG. 9A illustrates the nominal voltage applied to a particular pole of the deflector 121 by the scan controller 158 of FIG. 2 so as to scan and retrace the beam. FIG. 9B shows a superimposed voltage used to vary the focus and/or astigmatism state of the beam to provide the desired level of defocus. FIG. 9C shows the net voltage applied to the pole of the deflector 121 by the scan controller 158 to provide a focused scan and defocused retrace.

In general any element in the microscope may be used to oscillate the focus so long as it is capable of changing the focus at a rate commensurate with the scan line rate. This typically limits the choices to electrostatic elements since magnetic elements cannot be changed quickly due to magnetic hysteresis or inductance. Here, two non-limiting methods for defocusing the beam are described with reference to FIGS. 8A-8D, and 9A-9C, respectively.

In a first method, the electrostatic element 30 in FIG. 1 is used. The normal purpose of this element is to control the magnitude and polarity of the electric field in the vicinity of the wafer, element 100 in FIG. 1. This electrode is sometimes referred to as the charge control plate, proximity electrode, or wehnelt. To alter the focus, the electrode power supply 32 is switched between two voltage states, a first state being where the beam was focused, and the second providing the defocused state. A switching range of 1000V is typically sufficient, but depends upon the specific geometry of the electrodes so that the specifically required voltage change will depend upon the specifics of the electron optical system being used. For example, if the bore size of the electrode is approximately 3 mm and the distance between the electrode and the wafer is approximately 1 mm, the voltage change may be in the range of 100 to 500 volts.

In general, it is desirable to defocus the spot to a spatial extent of at least one micron. The controller 60 is used to temporally control both the line scan and the voltage switch so that the sequencing occurs as shown in FIGS. 8A-8D.

Generally, FIGS. 8A-8D show a suitable temporal sequence of the control signals and voltage for the example scan type shown in FIG. 4. Suitable temporal sequences for other scan types falling within the scope of the present invention, such as the scan types of FIGS. 3, 5 and 6, may be similar, mutatis mutandis. The time-line is shown comprising an idle period 510, a scan & image period 520, a defocus period 530, typically of a length which just suffices for the defocusing to occur, and an idle period 540. Typically brief first and second blanking periods 550 and 560 occur between periods 520 and 530, and periods 530 and 540 respectively.

FIG. 8C shows the option of using the beam blanking element of the column, if such is available, to prevent the beam spot from illuminating the wafer 100 at times when the electrode voltage (FIG. 8B) is being switched. This method allows the spot to defocused, and at the same time allows the electric field at the wafer surface to be altered, being made either more positive or negative depending upon the polarity of the switching power supply.

In a second method, also suitable for the example scan type shown in FIG. 4, the electrostatic octupole 121 in FIG. 2 is used to oscillate the focus. The octupole 121 is designed to allow scanning, focusing and astigmatism adjustment of the beam spot. Alternatively or in addition, a quadrupole, dodecapole, or other pole configuration could be used. In this embodiment, the electric field at the surface of the wafer is not changed.

In this embodiment, the electronics that determine the individual voltages of each pole of the octupole are designed to allow the scan, focus and astigmatism states to be applied to the entirety of the octupole. That is, each pole voltage can be individually controlled. Changing the focus state comprises superimposing an equivalent voltage upon the scan ramp of each of the 8 poles. FIGS. 9A-9C graph voltage which may be applied to one of the poles of the octupole. Either the focus or the astigmatism state of the entirety of the octupole can be changed to defocus the beam spot. FIG. 9A shows the temporal voltage applied to the pole for the purpose of scanning the beam spot. FIG. 9B shows the superimposed defocusing voltage. FIG. 9C shows the sum of the two voltages, which is the actual temporal voltage which may be applied to the pole. The superimposed voltage used to change the focus may be in the order of 20-50 volts for the SEM of FIG. 2.

For a de-focused spot which has a diameter of 100 scan lines (100 times the diameter of the focused spot), the following order of operations might be followed:

(a) De-focused scan covering an area of N focused lines (N, in the current example, is 100)

(b) Focused scan lines contained within the defocused area in the following sequence: 1, n+1, 2n+1, ... <N, where n is such that the charging of a line an+1 does not adversely impact the charging of line (a+1)n+1.

(c) De-focused scan covering an area of N lines incremented by one focus line from the de-focused scan line of step (a), e.g. if lines 1-100 were scanned in de-focused mode in step (a), lines 2-101 may be scanned in de-focused mode in step (c).

(d) Focused scan lines as in step (b) with the following sequence: 2, n+2, 2n+2, ... <N+1.

For example, in certain applications n may be 10 and a may be any integer between 1 and 10. The stage may move the wafer backwards by 1 scan line height every sequence, thereby moving the position of the scan sequence, relative to the wafer, forward by 1 scan line. The defocused beam covers an area of greater than 100 lines. The following operations may be performed:

Iteration 1: Scan line with defocused beam at position 1. Scan the following sequence of focused lines: 1, 11, 21, ... 91 within the area of the defocused scan.

Iteration 2: Scan line with defocused beam at position 2, which is an increment of 1 focused line forward from position 1. Scan the following sequence of focused lines: 2, 12, 22, ... 92.

Continue iterations 3, 4, ... until the entire slice (typically at least hundreds of thousands of lines) has been scanned. In subsequent iterations, lines may be re-scanned. For example, in the 11th iteration, lines 11, 21, 31, ... 101 may be scanned, all but the last of which (101) were scanned in the first iteration. Scan lines which are collected more than once may be, when converting to the final image, averaged between themselves, e.g. in an image controller, to obtain a single value which is used in the final image.

The order of the focused line acquisition can be varied, and the nature of the sequence can also be varied. For example, in step b, the sequence could be a permutation of that described above, such as 1, 3n+1, 2n+1, 4n+1, . . . so, if n=10, the sequence in step h is 1, 31, 21, 41, and so forth.

The present invention can be practiced by employing conventional tools, methodology and components. Accordingly, the details of such tools, components and methodology are not set forth herein in detail. In the previous description, numerous specific details are set forth, such as shapes of test structures and materials that are electro-optically active, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Features of the present invention which are described in the context of separate embodiments may also be provided in combination in a single embodiment. Conversely, features of the invention which are described for brevity in the context of a single embodiment may be provided separately or in any suitable subcombination.

The invention claimed is:

1. A method for electrically testing a semiconductor wafer, the method comprising:
    scanning a first de-focused scan area of the wafer by a de-focused charged particle beam along a first de-focused scan line so as to affect a charging of the first de-focused scan area, said de-focused scan area encompassing a first plurality N of focused scan lines;
    scanning a first number of the plurality of focused scan lines within the de-focused scan area by a focused charged particle beam while detecting electrons scattered from the wafer, said scanning of the first number of focused scan lines following a sequence 1, n+1, 2n+1, . . . <N, where n is such that the charging of a line an+1 does not adversely impact the charging of line (a+1)n+1;
    wherein, the scanning by the focused charged particle beam along the first number of focused scan lines occurs while the first number of focused scan lines remain affected by charging introduced by the scanning of the first de-focused scan area by the de-focused charged particle beam;
    scanning a second de-focused scan area of the wafer by the de-focused charged particle beam along a second de-focused scan line so as to affect a charging of the second de-focused scan area, said second de-focused scan area encompassing a second plurality N focused scan lines incremented by one focused scan line from the first plurality N of focused scan lines;
    scanning a second number of the second plurality of focused scan lines within the second de-focused scan area by the focused charged particle beam while detecting electrons scattered from the wafer, said scanning of the second number of focused scan lines following a sequence different than that used for scanning the first number of focused scan lines; and
    continuing to iteratively scan the wafer using the de-focused charged particle beam and the focused charged particle beam until to designated portion thereof has been scanned by the focused charged particle beam.

2. The method according to claim wherein a spot size formed by the de-focused charged particle beam is substantially larger than a spot size formed by the focused charged particle beam.

3. The method according to claim 1 wherein the de-focused scan lines are parallel to the focused scan lines.

4. The method according to claim 1 wherein the de-focused scan lines are transverse to the focused scan lines.

5. The method according to claim 1 wherein the de-focused charged particle beam scans along the de-focused scan lines in a first direction and the focused charged particle beam scans along the focused scan lines in a second direction substantially opposite to the first direction.

6. The method according to claim 1, wherein the first scanning of the first defocused scanning area includes introducing a defocusing electrostatic field in the vicinity of the wafer.

7. The method according to claim 1, wherein the first scanning of the first defocused scanning area includes introducing a defocusing electrostatic field at a location that is remote from the wafer.

8. The method according to claim 1, wherein the first scanning of the first defocused scanning area comprises defocusing the focused charged particle beam during a de-focusing period which is less than a few scan lines in duration.

9. The method according to claim 1, wherein the scanning by the focused charged particle beam comprises focusing the de-focused charged particle beam during a focusing period which is less than a few scan lines in duration.

10. A system for electrically testing a semiconductor wafer, the system comprising:
    at least one charged particle beam focus effecting component operative to generate at least one focused charged particle beam and at least one de-focused charged particle beam; and
    at least one detector adapted to collect charged particles scattered from the wafer;
    wherein, the system is adapted to (i) scan a first de-focused scan, area of the water using the de-focused charged particle beam along a first de-focused scan line so as to affect a charging of the first de-focused scan area, said de-focused scan area encompassing it first plurality N of focused scan lines, (ii) scan a first number of the plurality of focused scan lines within the de-focused scan area using the focused charged particle beam and detect electrons scattered from the wafer, the scan of the first number of focused scan lines following a sequence 1, n+1, 2n+1, . . . <N, where n is such that the charging of a line an+1 does not adversely impact the charging of line (a+1)n+1; wherein the scan by the focused charged particle beam along the first number of focused scan lines occurs while the first number of focused scan lines remain affected by charging introduced by the scan of the first de-focused scan area by the de-focused charged particle beam, (iii) scan a second de-focused scan area of the wafer by the de-focused charged particle beam along a second de-focused scan line so as to affect a charging of the second defocused scan area, said second de-focused scan area encompassing a second plurality N focused scan lines incremented by one focused scan line from the first plurality N of focused scan lines, (iv) scan a second number of the second plurality of focused scan lines within the second de-focused scan area by the focused charged particle beam while detecting electrons scattered from the wafer, said scanning of the second number of focused scan lines following a sequence different than that used for scanning the first number of focused scan lines, and (v) continue to iteratively scan the wafer until a designated portion thereof has been scanned by the focused charged particle beam.

11. The system according to claim 10 wherein a spot size formed by the de-focused charged particle beam is substantially larger than a spot size formed by the focused charged particle beam.

12. The system according to claim 10 wherein the de-focused scan lines are parallel to the focused scan lines.

13. The system according to claim 10 wherein the de-focused scan lines are transverse to the focused scan lines.

14. The system according to claim 10 wherein the de-focused charge particle beam scans along the de-focused scan lines in a first direction and the focused charged particle beam scans along the focused scan lines in a second direction substantially opposite to the first direction.

15. The method according to claim 10, wherein at least one charged particle beam focus effecting component is adapted to de-focus the focused charged particle beam by introducing a de-focusing electrostatic field in the vicinity of the wafer.

* * * * *